United States Patent [19]

Hall et al.

[11] Patent Number: 5,430,388
[45] Date of Patent: Jul. 4, 1995

[54] OUTPUT NOISE REDUCTION CIRCUIT

[75] Inventors: Andrew M. Hall, Bristol; Trevor K. Monk, Kent, both of United Kingdom

[73] Assignee: Inmos Limited, United Kingdom

[21] Appl. No.: 75,869

[22] Filed: Jun. 11, 1993

[30] Foreign Application Priority Data

Feb. 1, 1993 [GB] United Kingdom ............... 9301934

[51] Int. Cl.⁶ .......................................... H03K 17/16
[52] U.S. Cl. ...................................... 326/27; 326/121
[58] Field of Search ............... 307/451, 296.8, 443

[56] References Cited

U.S. PATENT DOCUMENTS

| | | | |
|---|---|---|---|
| 4,760,349 | 7/1988 | Park et al. | |
| 4,857,770 | 8/1989 | Partovi | 307/443 |
| 4,894,561 | 1/1990 | Nogami | 307/451 |
| 5,214,320 | 5/1993 | Truong | 307/296.8 |
| 5,220,208 | 6/1993 | Schenck | 307/443 |

FOREIGN PATENT DOCUMENTS

| | | |
|---|---|---|
| 1269304 | 10/1989 | Japan . |
| 2034939 | 6/1980 | United Kingdom . |
| 2175763 | 5/1986 | United Kingdom . |
| WO/88/082-28 | 10/1988 | WIPO . |

*Primary Examiner*—David R. Hudspeth
*Assistant Examiner*—Andrew Sanders
*Attorney, Agent, or Firm*—Felsman, Bradley, Gunter & Dillon

[57] ABSTRACT

A switching circuit for an FET transistor includes a controlled current circuit coupled to the gate of the FET. The input to the controlled current circuit represents a desired rate of change of gate voltage of the FET and is generated by a circuit responsive to the average specific transconductance of two FETs of similar specific transconductance operating at different drain circuit densities.

12 Claims, 5 Drawing Sheets

OUTPUT NOISE REDUCTION CIRCUIT

The invention relates to transistor switching and is particularly applicable to FET transistors used in output drivers for an integrated circuit device and to methods of operating FET transistors which may be used in such circuit devices. The invention is also applicable to detection of transconductance of such transistors and to controlling switching rates of such transistors in dependence on transconductance detection methods and circuits.

BACKGROUND OF THE INVENTION

Integrated circuit devices are commonly used to generate output signals which are supplied from an output terminal or pad to a load circuit on a connected printed circuit board. The high speed transmission of signals from an output pad of an IC chip to a load on a printed circuit board provides problems. Each time a signal is driven off the chip, the external load capacitance must be discharged or charged via the output driver circuitry and the inductance of the voltage supply lines. The inductance may be due to conventional features such as bond wires and lead frame. The capacitance which has to be driven by the driver circuitry may be formed from a mixture of printed circuit board track capacitance, load capacitance of the device on the printed circuit board and other integrated circuit input or output capacitance. When an integrated circuit device is connected to a load on a printed circuit board the ground and power supply lines on the integrated circuit chip as well as the output pad connected to the load circuit on the printed circuit board will each be connected to circuits including inductance and capacitance such that resonance occurs when transmitting output signals from the output pad. Oscillations in voltage caused in this way may cause temporary rise and fall in the voltage on the on chip ground and supply lines herein referred to as supply bounce. Such supply bounce has undesirable effects such as the injection of noise into sensitive analog circuits. The speed of switching of transistors in the output driver circuit will vary from chip to chip because of variations in the integrated circuit processing during manufacture and also due to variations in operating temperature. The supply bounce will be greatest if the particular chip has fast transistors whereas the signal propagation delay will be greatest if the chip has slow transistors. The design of output driver circuits is therefore a compromise between the speed of the output driver circuits and the acceptable level of on chip supply bounce.

The supply bounce is dependent on the rate of change of drain current in the transistors of the output driver circuits.

It is an object of the present invention to provide circuits and methods of controlling the rate of change of drain current in a switching transistor.

It is also an object of the present invention to provide a means of assessing the transconductance (that is rate of change of drain current with change in gate voltage) of a transistor.

SUMMARY OF THE INVENTION

The invention provides a method of controlling the rate of switching of an FET transistor between two different conducting states in response to a change in gate voltage, which method comprises generating a control signal representing a desired rate of change of gate voltage for said transistor, applying said control signal to a controlled current circuit to vary current flow in said circuit in dependence on said signal, and coupling said current circuit to the gate of the transistor so that the rate of change of gate voltage is dependent on current flow in said current circuit.

The invention also provides a method of controlling switching of an FET transistor in a driver circuit for an integrated circuit output terminal, wherein the rate of switching of said transistor between two different conducting states is controlled by generating a control signal representing a desired rate of change of gate voltage for said transistor, applying said control signal to a controlled current circuit to vary current flow in said circuit in dependence on said signal, and coupling said current circuit to the gate of the transistor so that the rate of change of gate voltage is dependent on current flow in said current circuit.

Said current circuit may act as a current source.

Said current circuit may act as a current sink.

Preferably said control signal comprises a bias signal to control DC current magnitude in said current circuit.

Preferably said control signal is dependent on the transconductance of said transistor, and this may be at a gate voltage for which the rate of change of drain current with time is to be controlled.

The generation of said control signal may comprise detecting the specific transconductance of at least one further transistor having proportional specific transconductance to said FET transistor and generating said control signal in dependence on the specific transconductance detected.

The invention also provides a method of generating a control signal representing specific transconductance of an FET transistor, which method comprises coupling two FET transistors, each having similar specific transconductance properties, to circuitry controlling current flow to determine a predetermined current difference in the drain circuits of the two transistors, providing different gate voltages to said two transistors and providing an output signal representing difference in the respective gate voltages at the respective drain currents for said two transistors thereby indicating the average specific transconductance of the two transistors at their respective gate voltages.

The said two transistors may have similar geometry with different drain current values to provide said difference in drain current densities.

Alternatively the said two transistors may have equal drain current values but different geometries to provide said difference in drain current densities.

The gate voltages of both transistors are such as to operate both transistors in the saturation region.

A current circuit may be arranged to provide a current having a value dependent on the difference in drain current values of the two transistors, said current circuit being coupled to the gates of the two transistors to provide different gate voltages to the respective gates.

Said current circuit may be controlled by a feedback loop responsive to a voltage dependent on differences in the drain currents of the two transistors.

The magnitude of the drain currents in the transistors is preferably controlled to select respective gate voltages applied to the two transistors.

The control signal representing average specific transconductance of the two transistors at their respective gate voltages may be used in the aforesaid method for controlling switching of an FET transistor.

The invention also provides a transistor switching circuit comprising an FET transistor switchable between two different conducting states in response to change in gate voltage and a control circuit for supplying a gate voltage to said transistor, said control circuit having circuitry for generating a control signal representing a desired rate of change of gate voltage for said transistor, and a controlled current circuit coupled to receive said control signal to vary current flow in dependence on said signal and coupled to the gate of the transistor so that the rate of change of gate voltage is dependent on current flow in said current circuit. The invention also provides a driver circuit for an integrated circuit output terminal which driver circuit comprises a FET transistor to connect said terminal to a supply line, said FET transistor being connected to a control circuit for supplying a gate voltage to said transistor, said control circuit having circuitry for generating a control signal representing a desired rate of change of gate voltage for said transistor, and controlled current circuitry coupled to receive said control signal to vary current flow in dependence on said signal and coupled to the gate of said transistor so that the rate of change of gate voltage of said transistor is dependent on current flow in said current circuit.

The invention also provides a specific transconductance detection circuit for FET transistors, comprising two FET transistors, a current controlling circuit for establishing a predetermined current density difference in the drain circuits of the two transistors, a gate biasing circuit to provide different gate voltages to said two transistors and output circuitry providing a signal representing difference in respective gate voltages at the respective drain current densities of said two transistors thereby indicating the average specific transconductance of the transistors at their respective gate voltages.

Preferably said current controlling circuit includes a current mirror circuit for establishing the current difference in the drain circuits of the two transistors.

A transistor switching circuit may have a control signal representing a desired rate of change of gate voltage for said transistor is determined by a specific transconductance detection circuit comprising two FET transistors connected in a current controlling circuit for establishing predetermined current density difference for the drain circuits of the two transistors, a gate biasing circuit to provide different gate voltages to said two transistors and output circuitry providing a signal representing difference in the respective gate voltages at the respective drain current densities of said two transistors thereby indicating the average specific transconductance of the two transistors at their respective gate voltages.

DESCRIPTION OF THE PREFERRED EMBODIMENTS

Figure 1:
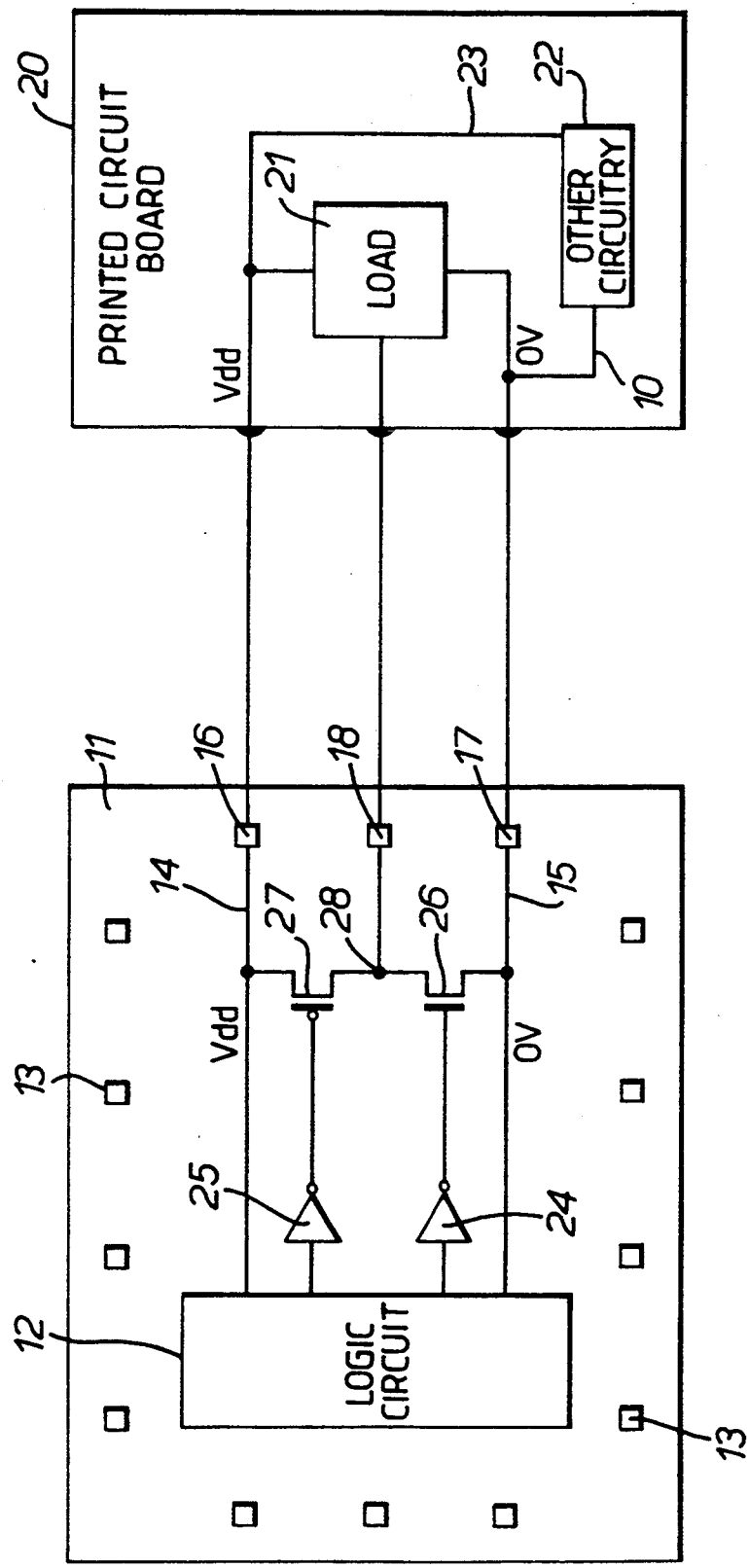
FIG. 1 shows a conventional manner of operating an output pad on an integrated circuit device connected to a load on a printed circuit board.

FIG. 1 shows an integrated device 11 of conventional construction incorporating a logic circuit 12 and having a plurality of output pads 13. In this example the circuit comprises CMOS components supplied with power by a power supply line 14 of 5 volts and a ground supply line 15 of 0 volts. Output pads 16 and 17 are used for power supply and ground connection respectively to connected circuitry which in this case comprises a printed circuit board 20. The printed circuit board is of conventional construction having a load circuit 21 which is to receive output signals from an output pad 18 on the integrated circuit chip. The printed circuit board includes other circuitry 22 and both the load 21 and the other circuitry 22 are connected to a power supply line 23 and ground line 10 which are connected respectively to the output pads 16 and 27 of the integrated circuit chip. It will be understood that the integrated circuit 11 will have many of its output pads connected to other circuitry in normal use but for simplicity only the operation of the output pad 18 will be described in this example. In order to output a logic signal from the logic circuit 12 a binary value will be output through inverters 24 and 25 to the gates of transistors 26 and 27 respectively. The transistors 26 and 27 are FET transistors of opposite conductivity type and connected in series between the power supply line 14 and the ground line 15. The output pad is connected to node 28 on the line between transistors 26 and 27. If transistor 27 is switched on then transistor 26 will be off and the pad 18 is connected to the supply line 14. If the binary signal has a different value such that transistor 26 is switched on then transistor 27 will be switched off so that the pad 18 is connected to the ground line 15 and disconnected from the power supply line 14. In this way the pad 18 moves towards the voltage of either line 14 or 15 due to current flow through either transistor 26 or 27. In order to transmit the signal from the logic circuit 12, pad 18 has to develop a voltage value above or below a particular threshold in order to indicate the nature of the binary signal which is being output and that signal must be propagated through bond wires, lead frame and PCB track before reaching the load 21 which is to respond to the output signal from the logic circuit 12. The circuitry both on chip and off chip to which the pads 16, 17 and 18 are connected will inevitably exhibit inductance, capacitance and resistance and fast switching of current flows through these circuits in order to output appropriate binary signals by the pad 18 will result in oscillation leading to supply bounce on the chip. The extent of supply bounce will depend on the rate of change of drain current through the transistors 26 and 27 and this will itself depend upon the speed of the transistors 26 and 27 as well as the speed of the transistors in the controlling logic 24 and 25. The speed of these transistors will vary depending upon the manufacturing conditions used when the transistors were formed as well as the operating temperatures during use.

Figure 9:
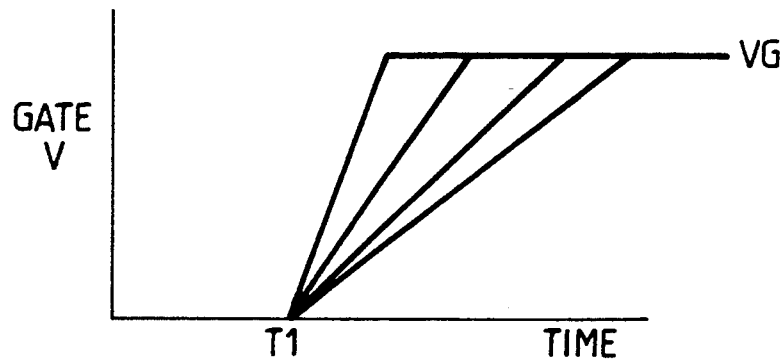
FIG. 9 shows variable gradient of gate voltage signal which may be used in the present invention.

The present examples provide a way of compensating for different speed of transistors resulting from different manufacturing conditions by allowing selection of a desired voltage gradient on the gates of transistors 26 and 27 in response to a change in binary signal from the logic circuit 12. This is illustrated in FIG. 9 which is a graph showing alternative voltage gradients for the gate voltage applied to transistors 26 and 27. In this specification gate voltage is the gate to source voltage difference of the transistor. This graph illustrates the gate voltage applied to one of those transistors where initially the gate voltage is of 0 value and after time T1 the respective logic circuitry 24,25 causes a change in gate voltage to a new value VG. The rate of change of the gate voltage may be selected to any suitable gradient such as the alternatives shown in FIG. 9 in order to control the rate of change of drain current in the transistors 26 and 27. By controlling the rate of change of drain current in this way speed variations of the transistors can be compensated and supply bounce thereby controlled so as to achieve an acceptable compromise between speed of the output driver and acceptable level of on chip supply bounce.

Figure 2:
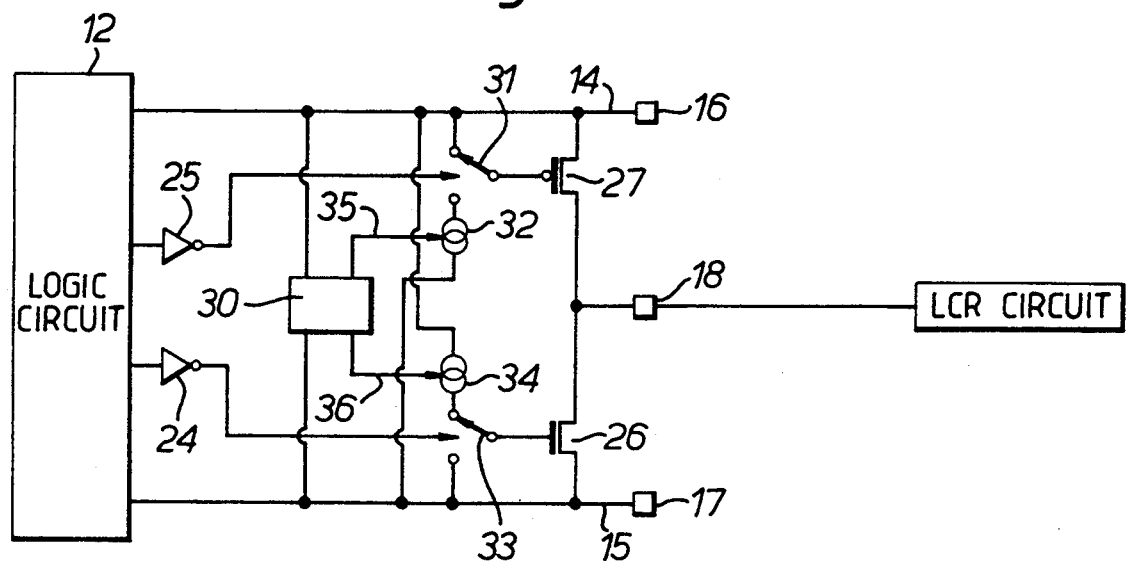
FIG. 2 shows schematically a modified integrated circuit device in accordance with the present invention for use with a printed circuit board of the type shown in FIG. 1.

An embodiment to achieve this control of voltage gradient applied to the gates of the transistors 26 and 27 is shown in FIG. 2. In this case the voltage gradient applied to the gate voltage signal of each of the transistors 26 and 27 is controlled by a single DC bias circuit 30. This is arranged to produce a reference voltage indicating the desired voltage gradient for the gate voltage of the transistors. The pull up transistor 27 has its gate connected to a switch 31 controlled by the output of the inverter 25. The switch 31 may connect the gate of transistor 27 to the supply line 14 or alternatively it may connect it to a current sink 32. Similarly the gate of transistor 26 is connected to a switch 33 which is controlled by the inverter 24. The switch 33 may connect the gate of transistor 26 either to the ground line 15 or to a current source 34. The current source 34 and current sink 32 are each controlled to permit a current flow dependent on the bias signal derived from the DC bias circuit 30. The circuit 30 is arranged to provide two outputs 35 and 36 connected respectively to the current sink 32 and current source 34. It will be appreciated that when either of the switches 31 or 33 is set to connect the respective gate to either the current source 34 or current sink 32 the current through the controlled current circuit 32 or 34 will cause a change in gate voltage of the type shown in FIG. 9 and the gradient will depend on the magnitude of the current permitted in the controlled current circuit 32 or 34. This in turn is controlled by the DC bias signal on lines 35 and 36.

Figure 3:
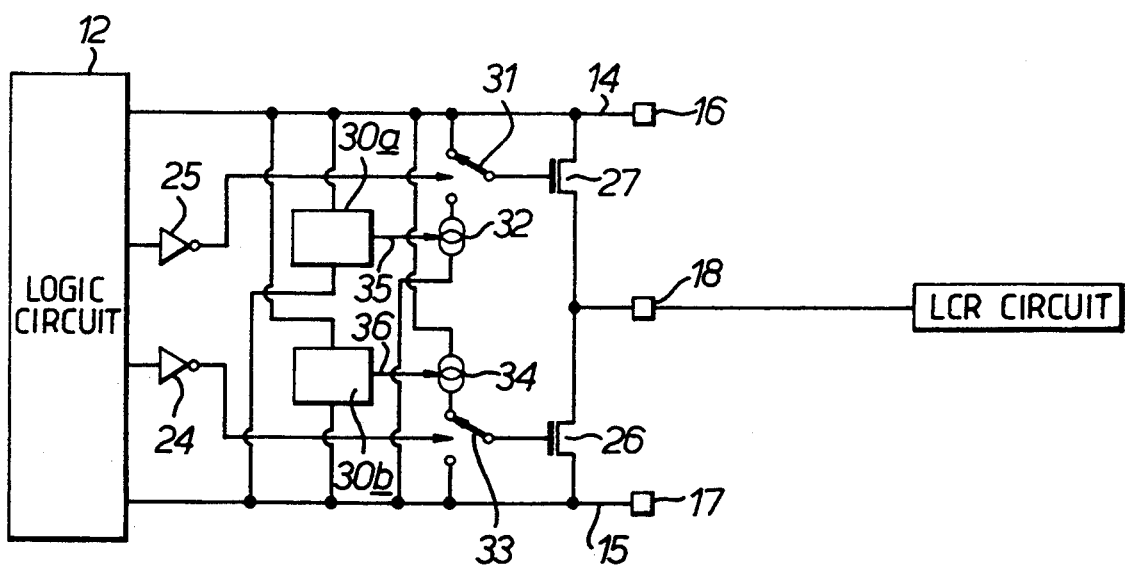
FIG. 3 shows schematically a further modified integrated circuit device in accordance with the present invention for use with a printed circuit board of the type shown in FIG. 1.

FIG. 3 shows an arrangement generally similar to FIG. 2 and similar reference numerals have been used. However in this case the DC bias generator 30 has been replaced by two separate DC bias generators 30A and 30B. Circuit 30A provides a single output 35 to control the current sink 32. Similarly the DC bias generator 30B provides a single output 36 controlling the current source 34.

In the preferred examples, the DC bias circuit 30 is arranged to provide an assessment of the transconductance (Gm) of the driver transistors 26 and 27 where:

$$Gm = d(drain\ current)/d(gate\ voltage)$$

Transconductance depends on the geometry of the transistors but variations arise from batch to batch variations during manufacture of transistors and also due to operating temperature conditions. If the output transistors 26,27 have a large Gm then the gate charge or discharge currents will be adjusted to be smaller than normal so that the gate voltages will change more slowly and hence the overall rate of change of drain current will be largely unchanged regardless of manufacturing variations.

Figure 4:
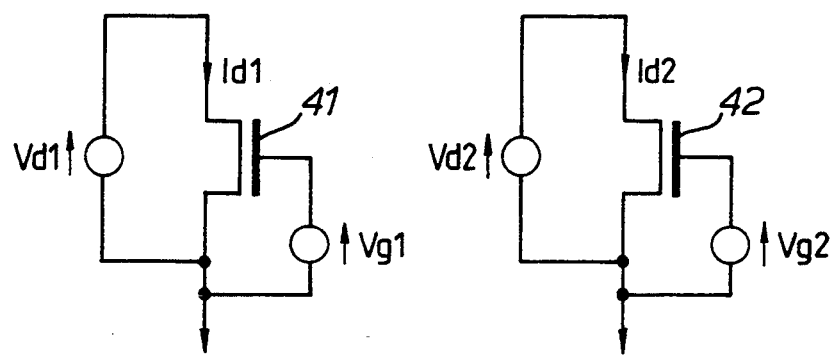
FIG. 4 shows circuits for measuring specific transconductance.

The average transconductance of a transistor could be measured by varying the gate voltage of the transistor and measuring the resulting variation of drain current. Unfortunately it is normally impractical to measure the drain current of the output transistors 26 and 27 but it is possible to measure the specific transconductance of transistors similar to those used in the final output stage. The specific transconductance, 'Sgm', is the size independent transconductance property of transistors, defined by:

$$Gm = W/L.Sgm$$

where 'Gm' is the transistor transconductance, 'W' is the transistor width and 'L' is the transistor length. In FIG. 4 transistor 41 is W1 wide and L1 long whereas transistor 42 is W2 wide and L2 long. As shown in FIG. 4, if transistors 41 and 42 are biased with currents Id1 and Id2 by applying gate voltages Vg1 and Vg2 respectively, then the specific transconductance can be determined as shown below. Note that drain voltages Vd1 and Vd2 are set so that both transistors operate in the saturation region.

Assuming that between gates voltages Vg1 and Vg2, Sgm is approximately constant, then the transconductances of transistors 41 and 42 are:

$$Gm1 = (W1/L1).Sgm$$

$$Gm2 = (W2/L2).Sgm$$

hence, neglecting threshold voltages for simplicity, the drain currents of transistors 41 and 42 are:

$$Id1 = Vg1.Gm1 = Vg1.(W1/L1).Sgm$$

$$Id2 = Vg2.Gm2 = Vg2.(W2/L2).Sgm$$

and hence the difference between Vg2 and Vg1 is:

$$Vg2 - Vg1 = (1/Sgm).(Id2.L2/W2 - Id1.L1/W1)$$

So if the drain currents are known then the difference in gate voltage is a measure of the reciprocal of specific transconductance.

Figure 5:
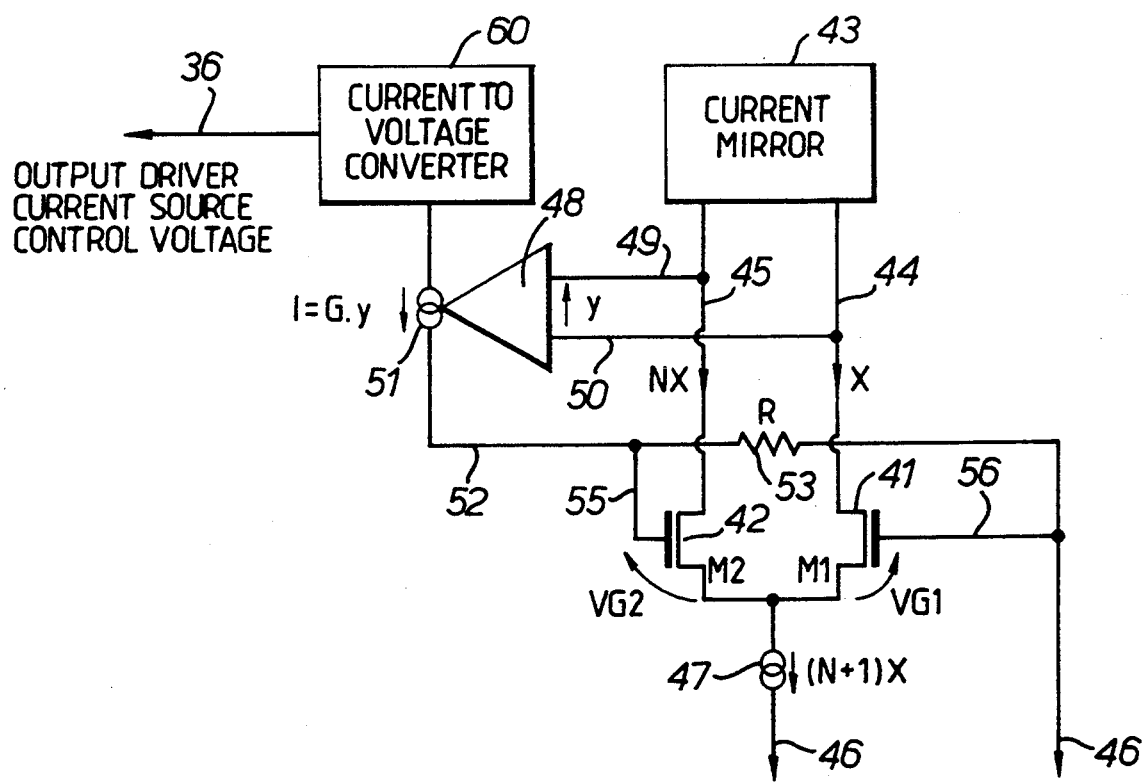
FIG. 5 shows further detail of part of the apparatus shown in FIG. 3.
Figure 8:
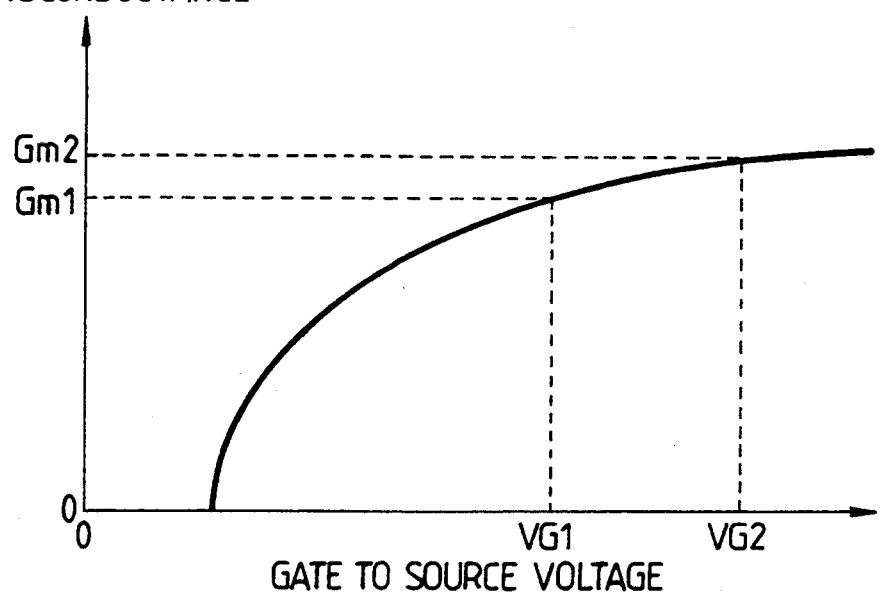
FIG. 8 illustrates transconductance variation of an FET transistor with gage voltage.

The arrangement of the DC bias generators 30A and 30B shown in FIG. 3 is illustrated more fully in FIG. 5. The circuit in FIG. 5 is arranged to provide the output voltage 36 to control the current source 34. The output signal is arranged to cause current flow in the current source 34 that is inversely proportional to the average transconductance of the output transistor 26 between two gate voltages VG1 and VG2 over which the control of rate of change of drain current is most critical to avoid unacceptable supply bounce. The transconductance of each of the transistors 26 and 27 varies with gate voltage as illustrated in FIG. 8. The output transistors have sub-micron channel lengths and are operated in the saturation region so that as shown in FIG. 8 the transconductance is relatively constant after the gate voltage has exceeded a particular value. As is illustrated in FIG. 8 two gate voltages VG1 and VG2 are selected on a part of the curve where the variation approximates to a straight line of small gradient. These two gate voltages correspond to transconductance values Gm1 and Gm2 of slightly different value but in this region of gate voltages the transconductance is relatively constant over a wide range of gate voltages. The particular gate voltages VG1 and VG2 are however selected to correspond to the operation of the transistors 26 and 27 where control of rate of change of drain current important.

The circuit shown in FIG. 5 is used to generate a signal inversely proportional to the specific transconductance of the transistors 41 and 42 shown in FIG. 4. The two FET transistors 41 and 42 are each made under similar operating conditions to the transistors 26 and 27 so that they may be expected to exhibit similar specific transconductance properties. The drains of transistors 41 and 42 are each connected to respective outputs of a current mirror circuit 43 arranged to control the ratio of currents in the drain circuits 44 and 45 to values X and NX respectively. The sources of both transistors 41 and 42 are connected to ground 46 by a common current path 47 which controls the total current value $(N+1).X$. A voltage to current amplifier 48 has two inputs 49 and 50 connected respectively to lines 45 and 44 so as to control a current source 51 in line 52 to generate a current I dependent on the difference in drain voltages of the transistors 41 and 42. The current flowing in line 52 passes through a resistor 53 to ground 46. One end of the resistor 53 is connected by line 55 to the gate of transistor 42 and the other end of the resistor 53 is connected by line 56 to the gate of transistor 41. The resistor 53 has a value R so that a difference in gate voltage exists for the two transistors 41 and 42. The gate voltage of transistor 41 is illustrated as VG1 whereas the gate voltage of transistor 42 is illustrated as VG2. If the circuit starts with Vg2 equal to Vg1, the drain current of transistor 42 will be less than NX. The current mirror circuit 43 attempts to adjust the current in lines 44 and 45 by making the drain voltage of transistor 42 higher than that of transistor 41. This results in a greater current in the output of the amplifier 48 thereby increasing the current flow through the resistor 53 and thereby increasing the voltage difference between the gates of the transistors 41 and 42. When the two drain currents achieve the required ratio N:1 set by the current mirror the circuit has reached a stable state and the current I flowing in line 52 is converted by a current to voltage converter 60 so as to provide a DC output bias voltage 36, dependant on current I, for controlling the current source 34.

Due to the current mirror 43 and the feed back circuit provided by 48 and 52:

The drain currents become Id1=X and Id2=NX Combining this with the equation for difference of gate voltages from FIG. 4 gives:

$$Vg2 - Vg1 = (1/Sgm).X.(N.L2/W2 - L1/W1)$$

Now ohms law gives:

$$I = (Vg2 - Vg1)/R$$

Hence:

$$I = (1/Sgm).(X/R).(N.L2/W2 - L1/W1)$$

In this way the current I is inversely proportional to the specific transconductance of the transistors in the DC bias circuit. As the operating points of transistors 41 and 42 are designed to match the critical operating range of the N channel output transistor 26 the specific transconductance of the three transistors 26, 41 and 42 is approximately the same. The geometry of the transistors 41 and 42 may be the same (W1=W2 and L1=L2) or they may have different values. Equally they may be the same or differ from the geometry of the transistors 26 and 27. The value of N may be 1 provided the geometry of the transistors 41 and 42 is different so as to provide a different current density in each.

Although the example shown in FIG. 5 is used for controlling the N channel output transistor 26 a similar circuit for measuring the transconductance of the P channel transistor 27 is provided in the circuit 30A where transistors 41 and 42 of FIG. 4 are replaced by similar P channel transistors. If however the ratio of N channel to P channel specific transconductance is well controlled then a scaled current based on current I in FIG. 5 can be used to control the P channel turn-on.

Figure 6:
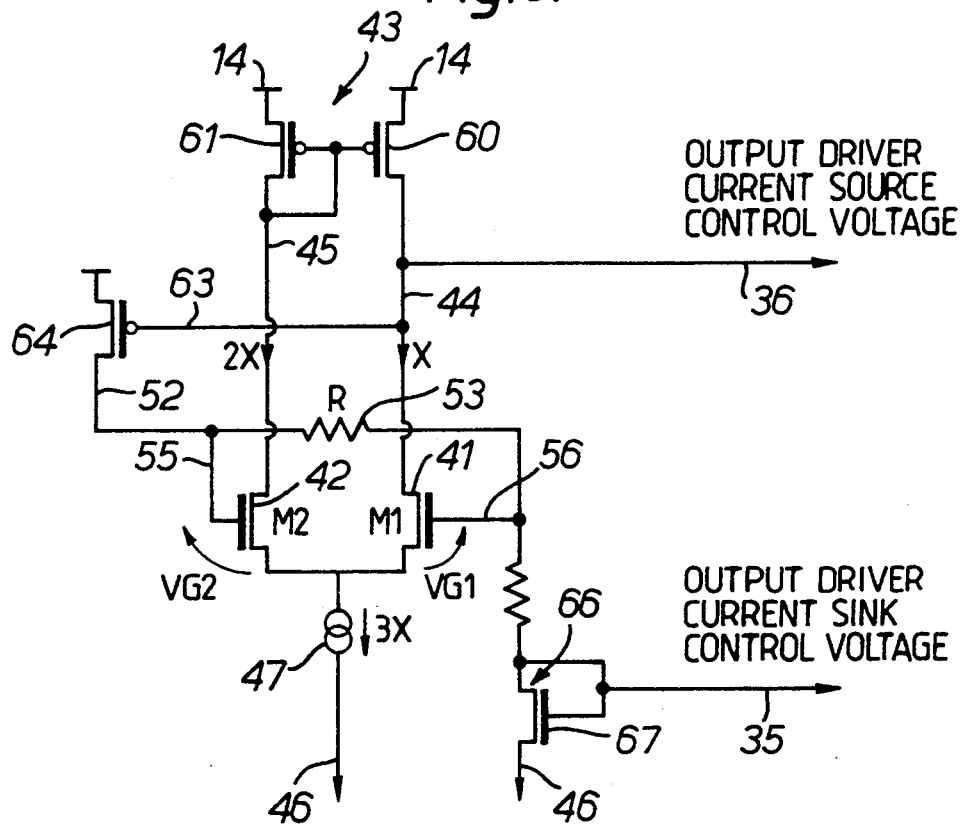
FIG. 6 shows an alternative to the arrangement of FIG. 3 which may be used in the apparatus of FIG. 2.

A further embodiment is illustrated in FIG. 6 where a single DC bias circuit such as 30 in FIG. 2 is shown in more detail and provides outputs 35 and 36. This example of FIG. 6 uses the same two N channel transistors 41 and 42 that have been described in FIG. 5 and similar reference numerals have been used for similar parts. In this case L1=L2, W1=W2 and N=2. The current mirror 43 is shown in more detail as consisting of two transistors 60 and 61, coupled in a conventional current mirror arrangement, and coupled respectively to the drains of transistors 41 and 42. In this case the current mirror 43 is again set to control the ratio of current flow through the two transistors 41 and 42 to change the drain voltages to a value where a current flow of 2X occurs through the drain of transistor 42 and a current flow X through the drain of the transistor 41. The overall current flow 3X through the transistors 41 and 42 is controlled by the current circuit 47. In this case the drain voltage of transistor 41 is taken directly from line 44 to provide the DC voltage on line 36 for controlling the current source 34. The same drain voltage of transistor 41 is fed on line 63 to the gate of a P channel transistor 64 which acts to control current flow in line 52. Due to the action of the current mirror the voltage on line 63 will be related to the difference in drain currents of the transistors 41 and 42. Transistor 64 is a P channel device similar to transistor 61. The gates of transistors 41 and 42 are connected to line 52 on opposite sides of the resistor 53 as previously described in FIG. 5 so as to achieve the required difference in gate voltages for the two transistors. As previously described with reference to FIG. 5 the current flow I in line 52 is inversely proportional to the average specific transconductance of the two transistors 41 and 42 as the equations given in relation to FIG. 5 equally apply to FIG. 6.

In this case $I = 1/Sgm.(X/R)$

It will be understood that the output voltage on line 36, being the gate voltage applied to transistor 64 is related to the current I in circuit 52. The current I flowing in circuit 52 passes through a current to voltage converter 66 in the form of a transistor 67 having its gate connected to its drain. The gate of transistor 67 is connected to line 35 and thereby provides an output voltage dependant on the current in line 52 and in this way the output voltage 35 will vary with the average transconductance detected. It will be seen that in this example the output signal 35 used to turn on the P channel transistor 27 is derived from a scaled current which is applicable if the ratio of N channel to P channel transconductance is well controlled.

It will be appreciated that in both the circuits of FIG. 5 and FIG. 6 the ratio of the drain currents of the two transistors 41 and 42, similar to the output driver transistors, is controlled by a current mirror so that it is possible to compare the difference in drain current densities which arise for the different gate voltages applied to the respective transistors 41 and 42. It is this measurement which is required by the definition of specific transconductance in order to provide an indication of the transconductance value for a given geometry and by using transistors 41 and 42 which have similar specific transconductance properties to the output transistors 26 and 27 this circuit may be used to generate a transconductance compensating signal to control the rate of change of drain currents in the transistors 26 and 27.

Although the above examples have been described with reference to the output drivers of an integrated circuit it is apparent that the control signals derived in circuits of FIG. 5 and FIG. 6 providing an indication of the transconductance may be used to compensate against variations in transistor speed due to manufacturing processes or operating temperatures in other applications. In particular they may be used to control the speed of operation of the transistors in voltage controlled oscillators or operational amplifiers.

The invention is not limited to the details of the foregoing examples.

Figure 7:
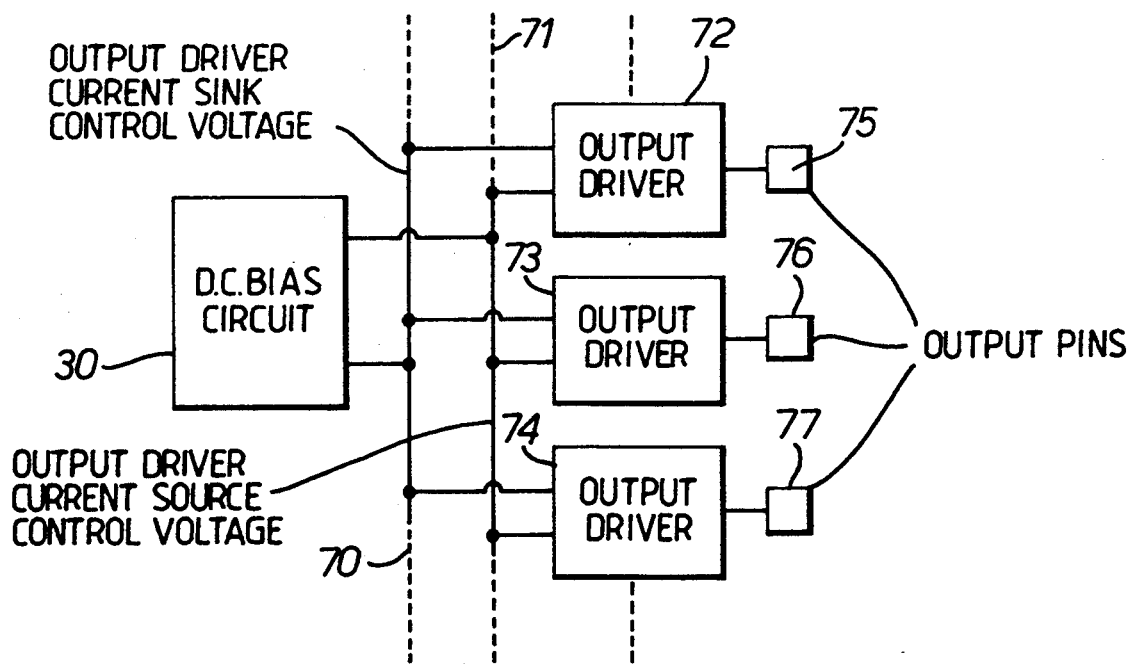
FIG. 7 shows schematically a further embodiment of the invention.

In the example of FIG. 2 the DC bias circuit 30 is used to control the transistors controlling a single output pad 18. It is however possible to arrange for the circuit 30 to control a plurality of outputs. Such an arrangement is shown in FIG. 7 where a single DC bias circuit 30 is arranged to provide one bias voltage on a current sink control voltage line 70 and another bias voltage on a current source control voltage line 71. Each of the lines 70 and 71 is connected to a plurality of output driver circuits 72, 73 and 74 connected to respective output pins 75, 76 and 77.

We claim:

1. A method of generating a control signal representing specific transconductance of an FET transistor, which method comprises coupling two FET transistors each having similar specific transconductance properties, to circuitry controlling current flow to establish a predetermined difference in the drain current densities of the two transistors, providing different gate voltages to said two transistors and providing an output signal representing difference in the respective gate voltages at the respective drain current densities for said two transistors thereby indicating the average specific transconductance of the two transistors at their respective gate voltages.

2. A method according to claim 1 in which the said two transistors have similar geometry with different drain current values to provide said difference in drain current densities.

3. A method according to claim 1 in which the said two transistors have equal drain current values but different geometries to provide said difference in drain current densities.

4. A method according to any one of claims 1 to 3 in which the gate voltages of both transistors are such as to operate both transistors in the saturation region.

5. A method according to claim 1 in which a current circuit is arranged to provide a current having a value dependent on the difference in drain current values of the two transistors, said current circuit being coupled to the gates of the two transistors to provide different gate voltages to the respective gates.

6. A method according to claim 5 in which said current circuit is controlled by a feedback loop responsive to a voltage dependent on differences in the drain currents of the two transistors.

7. A method according to claim 1 in which the magnitude of the drain currents in the transistors is controlled to select respective gate voltages applied to the two transistors.

8. A specific transconductance detection circuit for FET transistors, comprising two FET transistors, a current controlling circuit for establishing a predetermined current density difference in the drain circuits of the two transistors, a gate biasing circuit to provide different gate voltages to said two transistors and output circuitry providing a signal representing difference in respective gate voltages at the respective drain current densities of said two transistors thereby indicating the average specific transconductance of the transistors at their respective gate voltages.

9. A specific transconductance detection circuit according to claim 8 wherein said current controlling circuit includes a current mirror circuit for controlling the current difference in the drain circuits of the two transistors.

10. A detection circuit according to claim 9 in which the sources of the two transistors are connected to a common controlled current circuit controlling the sum of the currents in the drains of both transistors.

11. A transistor switching circuit comprising a switching FET switchable between two different conducting states in response to change in gate voltage and a control circuit for supplying a gate voltage to said switching FET, said control circuit having circuitry for generating a control signal representing a desired rate of change of gate voltage for said switching FET, wherein said control signal representing a desired rate of change of gate voltage for said Switching FET is determined by a specific transconductance detection circuit comprising two FET transistors connected in a current controlling circuit for establishing predetermined current density difference for the drain circuits of the two transistors, a gate biasing circuit to provide different gate voltages to said two transistors and output circuitry providing a signal representing difference in the respective gate voltages at the respective drain current densities of said two transistors thereby indicating the average specific transconductance of the two transistors at their respective gate voltages and a controlled current circuit coupled to receive said control signal to vary current flow in dependence on said signal and coupled to the gate of the switching FET so that the rate of change of gate voltage is dependent on current flow in said current circuit.

12. A method of controlling the rate of switching of a switching field effect transistor between two different conducting states in response to a change in gate voltage, which method comprises the following steps:

coupling said switching field effect transistor and a further field effect transistor, each transistor having similar specific transconductance properties, to circuitry controlling current flow to establish a predetermined difference in the drain current densities of the two transistors;

providing different gate voltages to said two transistors;

providing an output signal representing difference in the respective gate voltages at the respective drain current densities for said two transistors thereby indicating the average specific transconductance of the two transistors at their respective gate voltages;

generating a control signal in dependence on the average specific transconductance detected, said control signal representing a desired rate of change of gate voltage for said switching transistor;

applying said control signal to a controlled current circuit to vary current flow in said circuit in dependence on said signal; and coupling said current circuit to the gate of the switching transistor so that the rate of change of gate voltage is dependent on current flow in said current circuit.

* * * * *